(12) United States Patent
Mariani et al.

(10) Patent No.: US 9,356,092 B2
(45) Date of Patent: May 31, 2016

(54) SEMICONDUCTOR DEVICE AND METHOD FOR MANUFACTURING A SEMICONDUCTOR DEVICE

(71) Applicant: Infineon Technologies AG, Neubiberg (DE)

(72) Inventors: Franco Mariani, Regensburg (DE); Andreas Bauer, Landshut (DE); Reinhard Hess, Straubing (DE); Gerhard Leschik, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/025,185

(22) Filed: Sep. 12, 2013

(65) Prior Publication Data

US 2015/0069576 A1    Mar. 12, 2015

(51) Int. Cl.
*H01L 29/06* (2006.01)
*H01L 21/78* (2006.01)

(52) U.S. Cl.
CPC ............. *H01L 29/06* (2013.01); *H01L 21/78* (2013.01); *H01L 29/0684* (2013.01)

(58) Field of Classification Search
CPC ..................................................... H01L 21/78

USPC .......................................................... 257/618
See application file for complete search history.

(56) References Cited

U.S. PATENT DOCUMENTS

| | | | | |
|---|---|---|---|---|
| 8,652,969 | B2 * | 2/2014 | Fuller et al. | 438/703 |
| 2008/0001182 | A1 * | 1/2008 | Chen et al. | 257/255 |
| 2010/0019354 | A1 * | 1/2010 | Farooq et al. | 257/620 |
| 2010/0320574 | A1 * | 12/2010 | Kim | 257/618 |

* cited by examiner

*Primary Examiner* — Matthew W Such
*Assistant Examiner* — Warren H Kilpatrick
(74) *Attorney, Agent, or Firm* — Murphy, Bilak & Homiller, PLLC (57) ABSTRACT

A method includes providing a semiconductor wafer including multiple semiconductor chips, forming a first scribe line on a frontside of the semiconductor wafer, wherein the first scribe line has a first width and separates semiconductor chips of the semiconductor wafer, forming a second scribe line on the frontside of the semiconductor wafer, wherein the second scribe line has a second width and separates semiconductor chips of the semiconductor wafer, wherein the first scribe line and the second scribe line intersect in a crossing area which is greater than a product of the first width and the second width, and plasma etching the semiconductor wafer in the crossing area.

17 Claims, 6 Drawing Sheets

SEMICONDUCTOR DEVICE AND METHOD FOR MANUFACTURING A SEMICONDUCTOR DEVICE

TECHNICAL FIELD

The disclosure relates to semiconductor devices and methods for manufacturing semiconductor devices.

BACKGROUND

Semiconductor devices may be damaged during fabrication and operation. For example, defects may occur when semiconductor chips are separated from a semiconductor wafer using a dicing process. It may be desirable to improve the quality of semiconductor devices and methods for manufacturing the semiconductor devices. In particular, it may be desirable to avoid damage of the semiconductor devices during fabrication and operation.

SUMMARY

According to an embodiment, a method of separating semiconductor chips is disclosed. A semiconductor wafer comprising multiple semiconductor chips is provided. A first scribe line on a frontside of the semiconductor wafer is formed. The first scribe line has a first width and separates semiconductor chips of the semiconductor wafer. A second scribe line on the frontside of the semiconductor wafer is formed. The second scribe line has a second width and separates semiconductor chips of the semiconductor wafer. The first scribe line and the second scribe line intersect in a crossing area which is greater than a product of the first width and the second width. The semiconductor wafer is plasma etched in the crossing area.

According to another embodiment, a method of separating semiconductor chips is disclosed. A semiconductor wafer is provided. At least one semiconductor chip from the semiconductor wafer is formed. An outline of the at least one semiconductor chip on a frontside of the semiconductor wafer includes a beveled corner and/or a rounded corner. The semiconductor wafer is plasma etched in an area that is at least partly limited by the beveled corner and/or the rounded corner.

According to another embodiment, a semiconductor device is disclosed. The semiconductor device includes a semiconductor chip. An outline of a frontside of the semiconductor chip comprises a beveled corner and/or a rounded corner.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the scope of the present disclosure. The following detailed description, therefore, is not to be taken in a limiting sense, and the scope of the present disclosure is defined by the appended claims.

As employed in this specification, the terms "coupled" and/or "electrically coupled" are not meant to mean that the elements must be directly coupled together. Intervening elements may be provided between the "coupled" or "electrically coupled" elements.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Devices in accordance with the disclosure may include one or more semiconductor chips. The semiconductor chips may be of different types and may be manufactured using different technologies. For example, the semiconductor chips may include integrated electrical, electro-optical or electro-mechanical circuits, passives, etc. The integrated circuits may be designed as logic integrated circuits, analog integrated circuits, mixed signal integrated circuits, power integrated circuits, memory circuits, integrated passives, micro-electro mechanical systems, etc. For example, the semiconductor chips may include one or more power semiconductors and may have an integrated circuit configured to control the power semiconductor(s). Power semiconductor chips may have a vertical structure in which electric currents may flow in a direction perpendicular to the main faces of the semiconductor chips. For example, the vertical power semiconductor chips may be configured as power MOSFETs (Metal Oxide Semiconductor Field Effect Transistors), IGBTs (Insulated Gate Bipolar Transistors), JFETs (Junction Gate Field Effect Transistors), etc. The source electrode and gate electrode of a power MOSFET may be situated on one face while the drain electrode of the power MOSFET may be arranged on the other face.

The semiconductor chips need not be manufactured from a specific semiconductor material. For example, the semiconductor chip may include at least one of Si, SiC, SiGe, GaAs, etc. In addition, the semiconductor chips may contain inorganic and/or organic materials that are not semiconductors, such as, for example, insulators, plastics, metals, etc. The semiconductor chips may be packaged or unpackaged and may have dimensions. A thickness of the semiconductor chips may particularly be smaller than about 300 μm (micrometer) or smaller than about 250 μm (micrometer) or smaller than about 200 μm (micrometer) or smaller than about 175 μm (micrometer) or smaller than about 150 μm (micrometer) or smaller than about 125 μm (micrometer).

As used in this specification, the term "frontside" may particularly refer to a main face of the semiconductor chip that may include at least one of a doped region, an electrical component, a microelectronic component, an integrated circuit, etc. Semiconductor chips may be manufactured from a semiconductor wafer that may serve as a substrate for microelectronic devices to be built in and over the semiconductor wafer. The integrated circuits may be manufactured by doping, ion implantation, deposition of materials, photolithographic patterning, etc. The manufacturing acts usually may be performed on a specific main surface of the semiconductor wafer that may also be referred to as the "frontside" of the semiconductor wafer. After separating the individual semiconductor chips from the semiconductor wafer, the "frontside" of the semiconductor wafer may consequently become the "frontside" of the separated semiconductor chips.

The term "backside" of a semiconductor chip may refer to a main surface of the semiconductor chip that may be arranged opposite to the frontside of the semiconductor chip. The backside of the semiconductor chip may be free of electronic components, i.e. it may mainly consist of semiconductor material. Even though the backside of the semiconductor chip may not be processed similar to the frontside of the semiconductor chip, the backside may include contact pads providing an electrical coupling to inner electronic structures of the semiconductor chip. The frontside and the backside of the semiconductor chip may be connected by at least one side surface extending from the frontside to the backside.

A dicing process may be used for manufacturing devices in accordance with the present disclosure. In particular, the dicing process may be used to separate a semiconductor wafer into multiple semiconductor chips. In this regard, a suitable dicing technique may be applied, for example a plasma etching technique. A dicing process may generally be performed before or after a thinning of the semiconductor wafer. In the latter case, an etched trench may extend from the frontside of the semiconductor wafer to the backside of the semiconductor wafer. In the former case, a trench may be etched on the frontside of the semiconductor wafer, wherein the trench may not necessarily extend completely to the backside of the semiconductor wafer. The semiconductor wafer may then be thinned by removing semiconductor material from the backside of the semiconductor wafer until the semiconductor wafer is separated at the position of the previously formed trench. Any appropriate technique may be used for removing semiconductor material from the backside of the semiconductor wafer, for example at least one of grinding, polishing, etc.

The term "plasma etching" may refer to any suitable etching or dicing technique using a plasma, for example reactive ion etching, deep reactive ion etching, ion beam etching, etc. In plasma etching, a semiconductor wafer may be masked with a mask material, thereby leaving open areas between the individual semiconductor chips (or dies). The masked semiconductor wafer may then be processed using a reactive-gas plasma that may etch the semiconductor wafer material exposed between the semiconductor chips. Plasma etching may be performed by ionizing a gas mix inside a chamber to obtain ions that may react with the target material. An ionization of employed gases may be performed using a radio frequency excitation emitted by an electrode. A used plasma source (or etch species) may be charged (ions) and/or neutral (atoms and radicals). During a plasma etching process, the plasma may generate volatile etch products from chemical reactions between the elements of the material to be etched and the reactive species generated by the plasma. Atoms of the treated element may embed themselves on or below the surface of the target material such that the physical properties of the target material may be modified.

Chemistries of gases used for a plasma etching act may particularly depend on the material to be etched. For example, a halogen (fluorine, chlorine, bromine or iodine) gas or halogen-containing gas may be used, wherein one or more additional gases may be added to improve an etch quality (e.g. etch anisotropy, mask selectivity, etch uniformity, etc.). For example, gases including fluorine, such as e.g. $SF_6$, $F_2$ or $NF_3$, may be used for etching silicon. Gases including chlorine and/or bromine may be used for etching III-V materials.

Semiconductor chips included in devices in accordance with the present disclosure may have an undulation that may particularly be located at one or more side surfaces of the semiconductor chips. For example, the side surfaces of the semiconductor chip may undulate with an amplitude from e.g. about 100 nm to e.g. about 5 μm (micrometer) or from e.g. about 100 nm to e.g. about 500 nm. The undulations may result from a plasma etching process that may have been used to separate the semiconductor chip from a semiconductor wafer. For example, a time-modulated two-phase etching process may be employed to etch trenches (or grooves) into the semiconductor wafer at the positions where the semiconductor wafer is to be separated. The process may include a first phase, in which an isotropic plasma etching act may be performed, and a second phase, in which a passivation layer that may be configured to protect the side walls of the trench during the etching act may be deposited. The etching act of the first phase and the depositing act of the second phase may be repeated multiple times resulting in multiple etching acts taking place at the bottom of the trench leading to the mentioned undulation (or wave form or wave shape) of the side surfaces. For example, the acts of the first and second phase may be repeated from e.g. about 10 times to e.g. about 100 times. The amplitude of the undulation as well as the depth of the etched trench 9 may particularly depend on the number of repetitions of the acts of the first and second phase. In particular, the amplitude of the undulation may decrease with an increased number of repetitions (for a given thickness of the semiconductor wafer to be etched).

Using processes like sawing or laser dicing for separating a semiconductor wafer may result in damage of the semiconductor material at the side surfaces of the semiconductor chip. Such damage may at least partly be avoided by employing an etching process for separating the semiconductor wafer. For example, a plasma etching process may be used in this regard. In one example, the side surfaces of the semiconductor chips may remain free of defects extending from the side surfaces into the semiconductor material. In another example, defects extending from the side surfaces into the semiconductor material may occur, wherein a dimension of the defects may be smaller than e.g. about 20 μm (micrometer) or smaller than e.g. about 10 μm (micrometer) or smaller than e.g. about 5 μm (micrometer). However, applying e.g. a mechanical or laser dicing technique for separating the semiconductor wafer may result in defects of the semiconductor material, the defects extending from the side surfaces into the separated semiconductor chips. Directly after the dicing process, the defects may have a dimension of e.g. about a few micrometer up to e.g. about 100 µm (micrometer). After further thermal stress and/or application stress that may occur during further manufacturing acts and/or an operation of the separated semiconductor chips, the defects may increase up to several hundreds of micrometer.

Scribe lines may be used for manufacturing devices in accordance with the disclosure. The scribe lines may be arranged between semiconductor chips (or dies) on a frontside of a semiconductor wafer and may indicate locations where the semiconductor wafer is to be separated into the individual semiconductor chips by a dicing process. In particular, the scribe lines may be free of metal that has been used during a fabrication of electronic structures of the semiconductor chips. The scribe lines may have a width from e.g. about 5 µm (micrometer) to e.g. about 100 µm (micrometer) or from e.g. about 15 µm (micrometer) to e.g. about 50 µm (micrometer). The width of the scribe lines may particularly depend on alignment properties and/or a sensitivity of the semiconductor chips and/or alignment properties of employed lithography levels. Referring back to the previously described plasma etching process, a layout of the scribe lines may be (substantially) similar to a layout of an etching mask used for the etching process.

FIGS. 1A to 1E schematically illustrate a method for manufacturing a device in accordance with the disclosure. A similar but more detailed method is described in connection with FIGS. 4A to 4F.

Figure 1A:
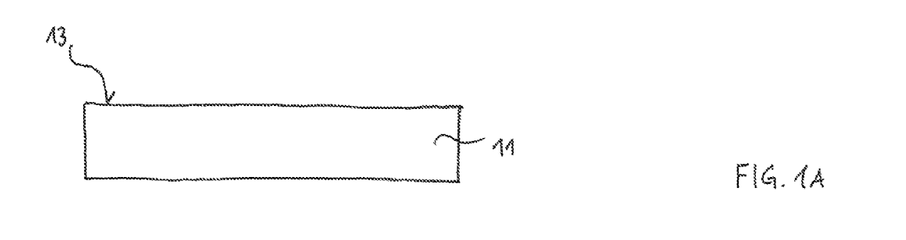
FIGS. 1A to 1E schematically illustrate an exemplary method for manufacturing a device in accordance with the disclosure.

In FIG. 1A, a semiconductor wafer 11 having a frontside 13 may be provided. FIG. 1A illustrates a cross-sectional side view of the semiconductor wafer 11.

Figure 1B:
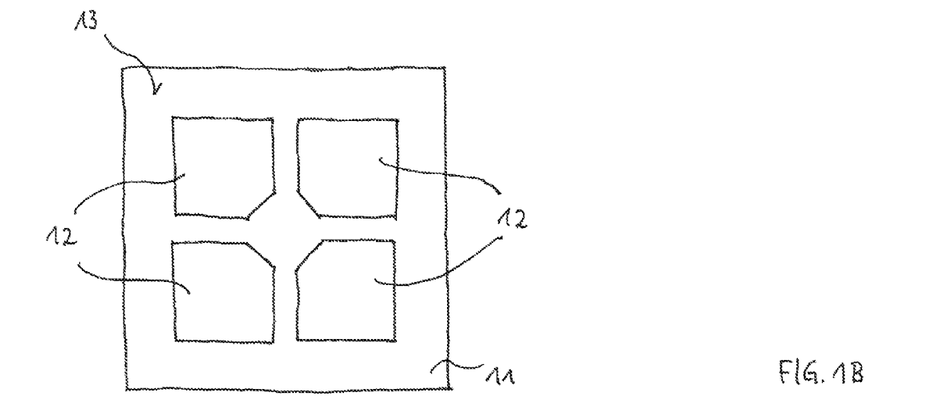

FIG. 1B illustrates a top view of the semiconductor wafer 11. The semiconductor wafer 11 may include multiple semiconductor chips 12. In the example of FIG. 1B, only four semiconductor chips 12 are shown for the sake of simplicity. However, the actual number of semiconductor chips 12 formed on the semiconductor wafer 11 may vary.

Figure 1C:
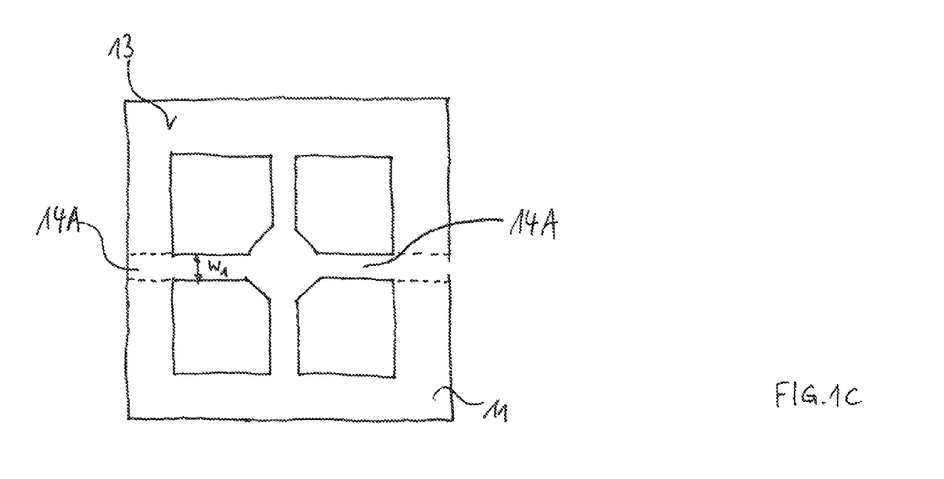

In FIG. 1C, a first scribe line 14A may be formed on the frontside 13 of the semiconductor wafer 11. For example, the first scribe line 14A may separate the semiconductor chips 12 arranged in the lower half of the frontside 13 from the semiconductor chips 12 arranged in the upper half of the frontside 13. Particularly in the areas between the semiconductor chips 12, the first scribe line 14A may have a first width $w_1$ that may be substantially constant.

Figure 1D:
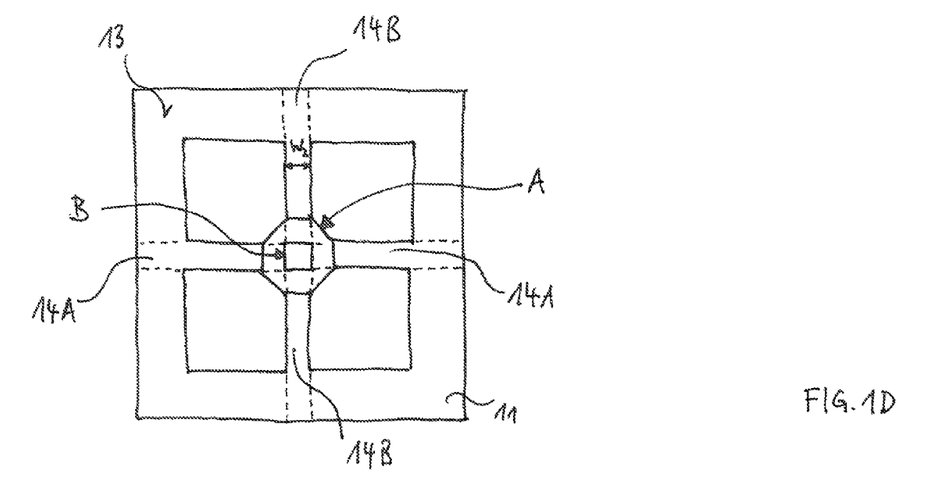

In FIG. 1D, a second scribe line 14B may be formed on the frontside 13 of the semiconductor wafer 11. For example, the second scribe line 14B may separate the semiconductor chips 12 arranged in the left half of the frontside 13 from the semiconductor chips 12 arranged in the right half of the frontside 13. Particularly in the areas between the semiconductor chips 12, the second scribe line 14B may have a second width $w_2$ that may be substantially constant. The first scribe line 14A and the second scribe line 14B may form a crossing area A. In the example of FIG. 1D, an outline of the crossing area A has the shape of an octagon. The crossing area A may be greater than a product of the first width $w_1$ and the second width $w_1$, which may correspond to an area of a rectangle B.

Figure 1E:
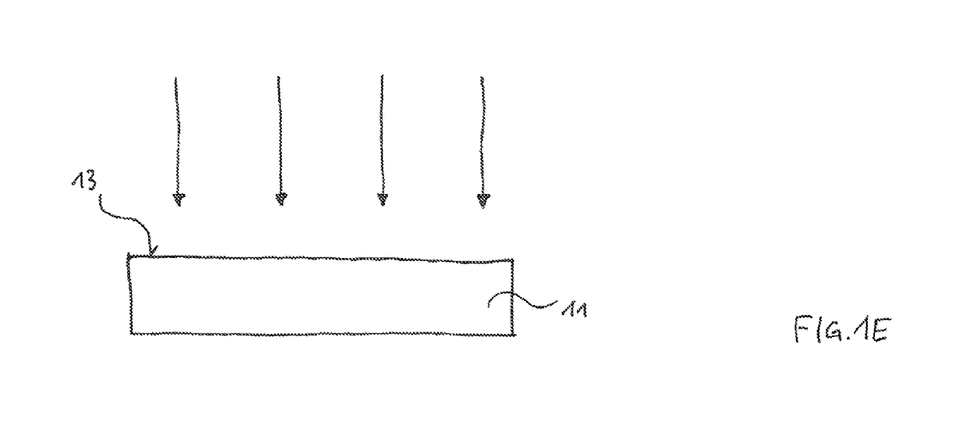

In FIG. 1E, the semiconductor wafer 11 may be plasma etched in the crossing area A. The process of plasma etching is indicated by arrows.

FIGS. 2A to 2E schematically illustrate a method for manufacturing a device in accordance with the disclosure. A similar but more detailed method is described in connection with FIGS. 4A to 4F.

Figure 2A:
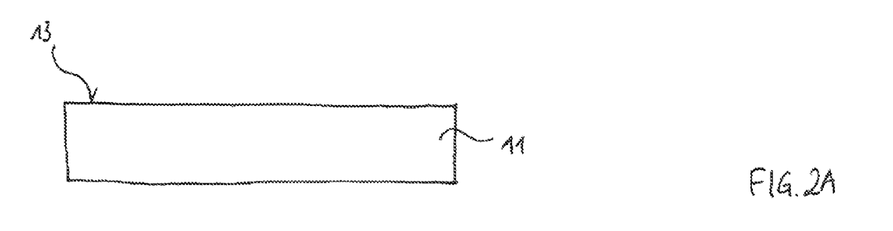
FIGS. 2A to 2C schematically illustrate a further exemplary method for manufacturing a device in accordance with the disclosure.

In FIG. 2A, a semiconductor wafer 11 having a frontside 13 may be provided. FIG. 2A illustrates a cross-sectional side view of the semiconductor wafer 11.

Figure 2B:
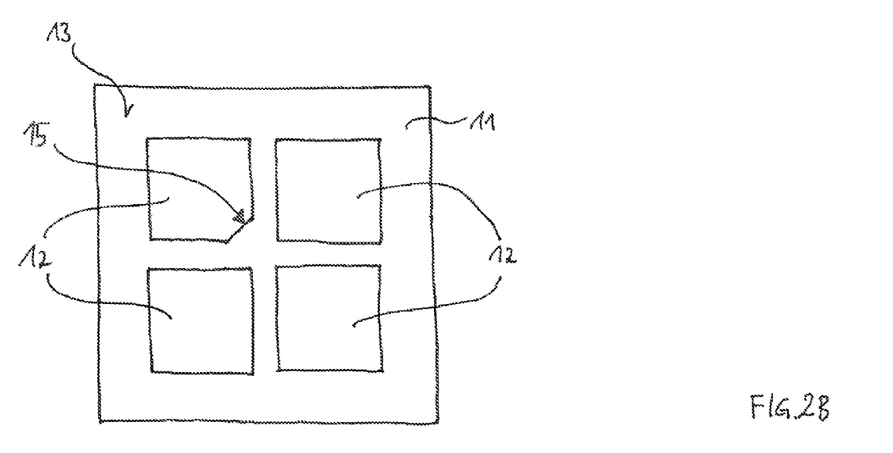

FIG. 2B illustrates a top view of the semiconductor wafer 11. Semiconductor chips 12 may be formed from the semiconductor wafer 11. In the example of FIG. 2B, only four exemplary semiconductor chips 12 are shown for the sake of simplicity. However, the actual number of semiconductor chips 12 formed from the semiconductor wafer 11 may vary. An outline of at least one of the semiconductor chips 12 on the frontside 13 of the semiconductor wafer 11 may include a beveled corner and/or a rounded corner. In the example of FIG. 2B, the semiconductor chip 12 at the top left may include a beveled corner 15. However, in another example the semiconductor chip 12 may instead include a rounded corner. In further examples, one or more of the further semiconductor chips 12 may also include a beveled corner and/or a rounded corner.

Figure 2C:
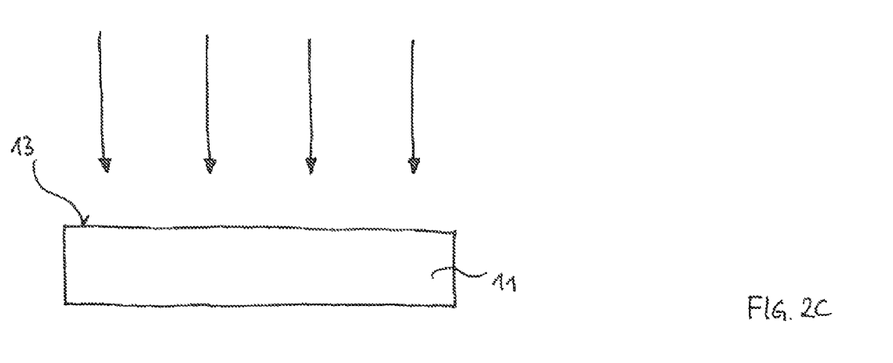

In FIG. 2C, the semiconductor wafer 11 may be plasma etched in an area that may be at least partly limited by the beveled corner 15 and/or the rounded corner. The process of plasma etching is indicated by arrows.

Figure 3A:
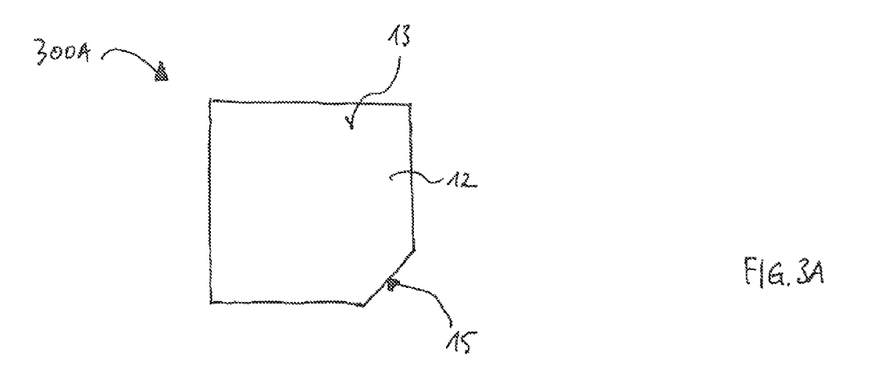
FIGS. 3A and 3B schematically illustrate exemplary devices in accordance with the disclosure.
Figure 3B:
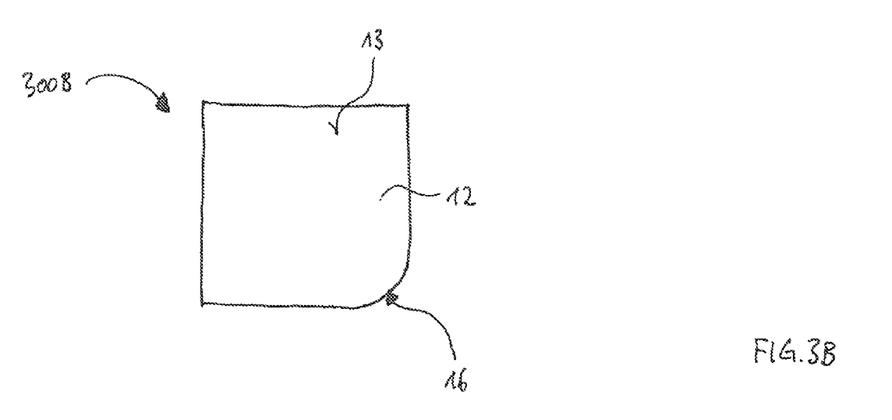

FIGS. 3A and 3B schematically illustrate top views of devices 300A and 300B in accordance with the disclosure. For example, the devices 300A and 300B may be manufactured by one of the previously described methods.

The device 300A may include a semiconductor chip 12, wherein an outline of a frontside 13 of the semiconductor chip 12 may include a beveled corner 15.

The device 300B may include a semiconductor chip 12, wherein an outline of a frontside 13 of the semiconductor chip 12 may include a rounded corner 16.

In the examples of FIGS. 3A and 3B, the respective semiconductor chip 12 only includes one beveled or rounded corner. In further examples, the semiconductor chip 12 may include a number of beveled corners and/or a number of rounded corners.

Figure 4A:
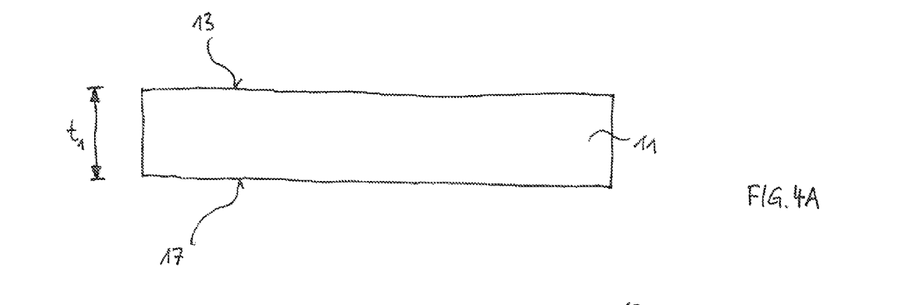
FIGS. 4A to 4F schematically illustrate a further exemplary method for manufacturing a device in accordance with the disclosure.
Figure 4B:
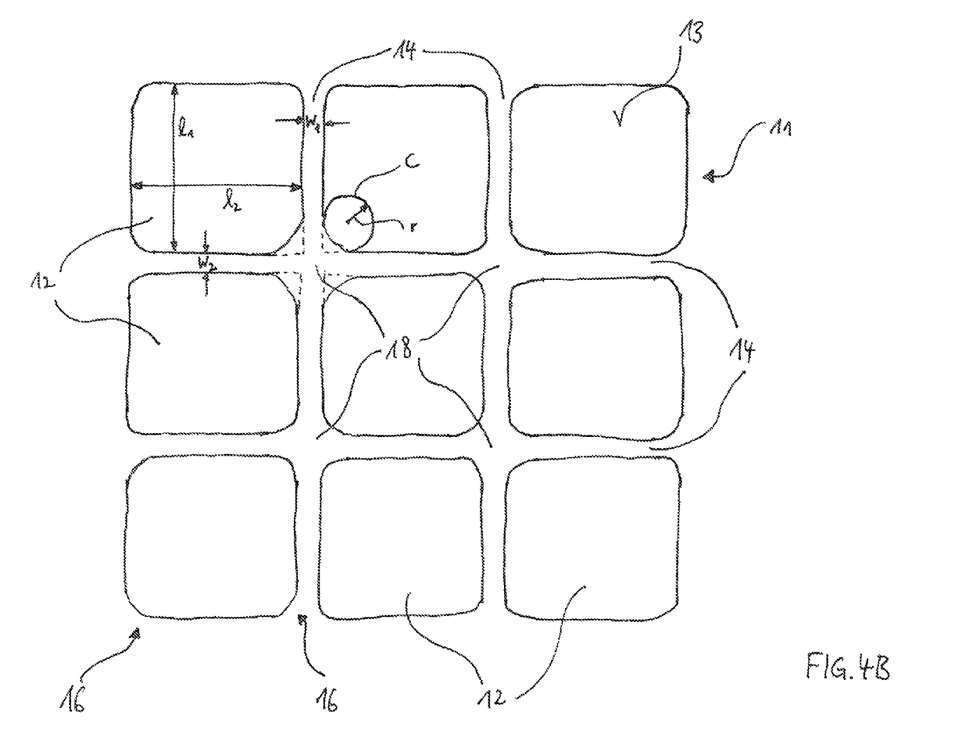
Figure 4C:
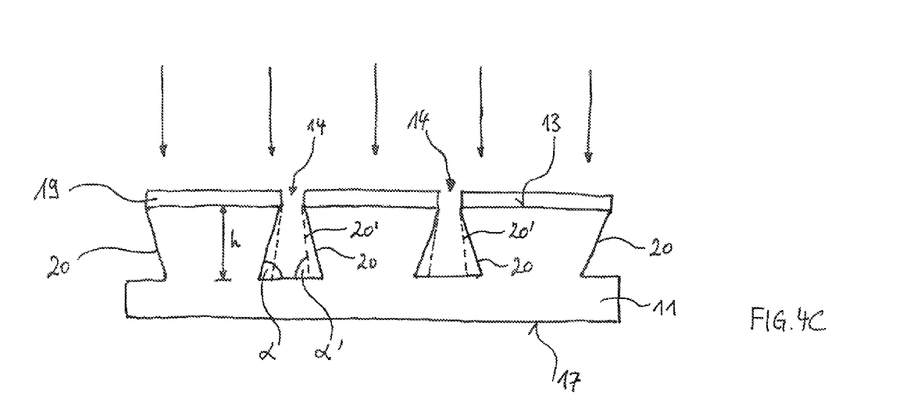
Figure 4D:
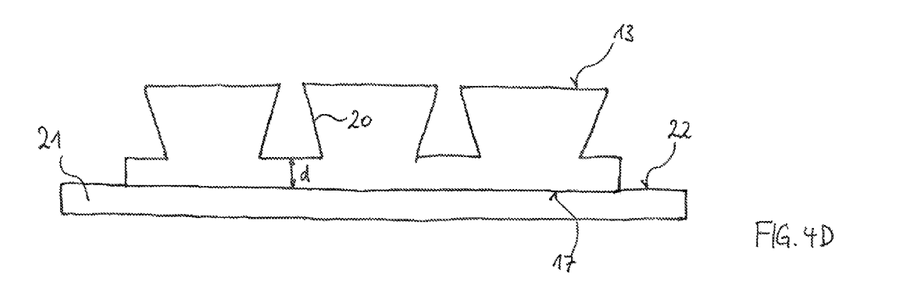
Figure 4E:
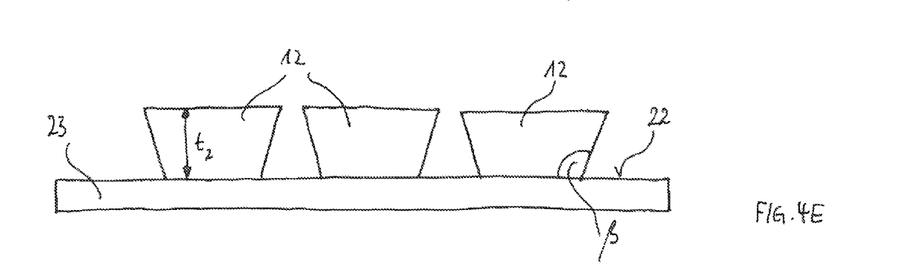
Figure 4F:
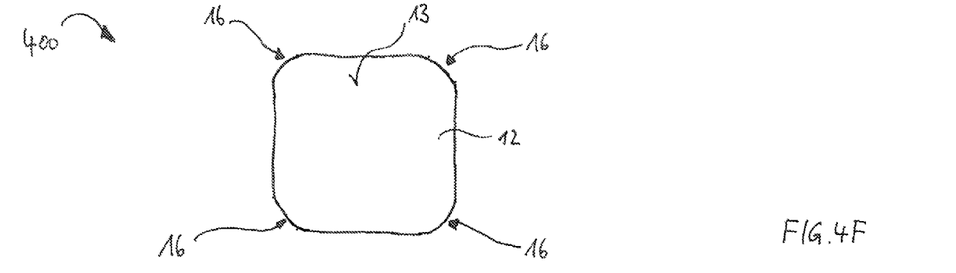

FIGS. 4A to 4F schematically illustrate a method for manufacturing a device in accordance with the disclosure. A cross section of an exemplary manufactured device 400 obtained by the method is shown in FIG. 4F. Details of devices manufactured according to the described method may be likewise applied to any other device in accordance with the disclosure. In addition, the method shown in FIGS. 4A to 4F may be seen as an implementation of the method of FIGS. 1A to 1E or the method of FIGS. 2A to 2C. Details of the manufacturing method that are described below may therefore be likewise applied to one of the previously described methods.

In FIG. 4A, a semiconductor wafer 11 having a frontside 13 and a backside 17 may be provided. The semiconductor wafer 11 may be made of any semiconductor material and may have a variety of dimensions. For example, a thickness $t_1$ of the semiconductor wafer 11 may be smaller than about 800 µm or smaller than about 700 µm or smaller than about 600 µm or smaller than about 500 µm or smaller than about 400 µm or smaller than about 300 µm or smaller than about 200 µm or e.g. smaller than about 150 µm. The thickness $t_1$ of the semiconductor wafer 11 may be reduced later on by removing semiconductor material from the backside 17 of the semiconductor wafer 11.

FIG. 4B illustrates a top view of a part of the semiconductor wafer 11, i.e. a part of the frontside 13. One or more semiconductor chips (or dies) 12 may be formed on the semiconductor wafer 11. For the sake of simplicity, only nine semiconductor chips 12 are illustrated. However, the actual number of semiconductor chips 12 formed on the semiconductor wafer 11 may vary. The frontside of each semiconductor chip 12 may include at least one of a doped region, an electrical component and an integrated circuit. For example, manufacturing the semiconductor chips 12 and integrated circuits included therein may include at least one of doping, ion implantation, deposition of materials, photolithographic patterning, etc.

The semiconductor chips 12 may vary in shape and size. In particular, the semiconductor chips 12 may be fabricated according to the shape of scribe lines 14 that may be formed on the frontside 13 between the semiconductor chips 12. The scribe lines 14 may indicate locations where the semiconductor wafer 11 is to be separated into the individual semiconductor chips 12 later on. In the example of FIG. 4B, the semiconductor chips 12 may be of substantially rectangular shape including sides having lengths $l_1$ and $l_2$. The lengths $l_1$ and $l_2$ may differ from each other or may be similar. Each of the lengths $l_1$ and $l_2$ may lie in a range from about 400 µm (micrometer) to about 1400 µm (micrometer) or from about 500 µm (micrometer) to about 1300 µm (micrometer) or from about 600 µm (micrometer) to about 1250 µm (micrometer). In one specific example, the length $l_1$ may be e.g. about 1100 µm (micrometer) and the length $l_2$ may be e.g. about 625 µm (micrometer).

In the example of FIG. 4B, the scribe lines 14 may form a substantially rectangular lattice dividing the semiconductor wafer 11 into the multiple semiconductor chips 12. In further examples, the lattice may have a different form, for example a diamond pattern. In the example of FIG. 4B, the scribe lines 14 are illustrated as straight lines. However, the scribe lines 14 may also be of different shape. For example, one or more of the scribe lines 14 may be curved, wavelike, undulated, etc. The scribe lines 14 may be formed between the semiconductor chips 12 and may intersect at crossings 18. The scribe lines 14 may be formed such that an outline of the semiconductor chips 12 may include an arc-shaped line. The corners 16 of the semiconductor chips 12 may thus be rounded. For example, the outline of the semiconductor chips 12 may be similar to the outline of the semiconductor chip 12 in FIG. 3B.

In one example, the arc-shaped line may include or may correspond to a segment of a circle. An exemplary circle C is illustrated in one of the semiconductor chips 12 for illustrative purposes. The circle C may have a radius r from about 80 µm (micrometer) to about 90 µm (micrometer) or from about 75 µm (micrometer) to about 95 µm (micrometer) or from about 70 µm (micrometer) to about 100 µm (micrometer) or from about 65 µm (micrometer) to about 105 µm (micrometer). In further examples, the radius r may even be smaller than about 65 µm (micrometer) or may even be greater than about 105 µm (micrometer).

In the example of FIG. 4B, each of the illustrated semiconductor chips 12 may include four rounded corners. In further examples, each of the semiconductor chip 12 may include different numbers of rounded corners depending on the respective overall shape of the semiconductor chip 12.

In a further example, the scribe lines 14 may be formed such that an outline of the semiconductor chips 12 may include a polygonal line including two line segments joined together at an inner angle of greater than 90°. That is, the corners of the semiconductor chips 12 may also be beveled. In this case, the outline of the semiconductor chips 12 may be similar to the outline of the semiconductor chip 12 of FIG. 3A. The size of a beveled corner may be similar to the size of a rounded corner as described above. In further examples, the outline of a semiconductor chip 12 may include a combination rounded corners and beveled corners.

An alternative semiconductor wafer (not illustrated) different from the semiconductor wafer 11 shown in FIG. 4B may include scribe lines 14 arranged such that the corners of the semiconductor chips 12 may be rectangular at the crossings 18. In FIG. 4B, such alternative arrangement is indicated by dashed lines at the crossing 18 at the top left side of FIG. 4B, where the alternative crossing 18 between the alternative scribe lines 14 may be similar to a rectangle. For example, a first scribe line 14 may have a width $w_1$, and a second scribe line 14 may have a width $w_2$ such that a surface area of the rectangular crossing may correspond to a product of the first width $w_1$ and the second width $w_2$. As can be seen from FIG. 4B, the surface area of the rectangle is smaller than the surface area of the crossing area formed by the semiconductor chips 12 including rounded corners.

The widths $w_1$ and $w_2$ of the scribe lines 14 may be similar, but may also differ from each other. Each of the widths $w_1$ and $w_2$ may lie in a range from about 5 µm (micrometer) to about 100 mm (micrometer) or from about 15 µm (micrometer) to about 50 µm (micrometer) or from e.g. about 10 µm (micrometer) to e.g. about 30 µm (micrometer). In one example, one or both widths $w_1$ and $w_2$ may have a value of e.g. about 17.5 µm (micrometer).

In FIG. 4C, a structured mask 19 of an etch resistant material may be arranged over (or on) the frontside 13 of the semiconductor wafer 11. Areas that are to be etched may remain exposed from the structured mask 19. For example, the structured mask 19 may have been patterned using a photolithographic technique. In particular, the shape of the structured mask 19 may be similar or may be equal to the shape of the scribe lines 14. After arranging the structured mask 19, the frontside 13 of the semiconductor wafer 11 may be plasma etched. Particles of the plasma may be accelerated towards the frontside 13 of the semiconductor wafer 11 such that the particles may attack the semiconductor wafer 11 in a substantially vertical direction (see arrows).

During the plasma etching process, trenches (or grooves) 20 may be formed at the positions of exposed semiconductor material, i.e. at the positions of the scribe lines 14. In the example of the FIG. 4C, the trenches 20 may be formed when the semiconductor chips 12 (or their electronic structures) may have already been manufactured. However, in other examples the semiconductor chips 12 may also be formed after the trenches 20 have been etched. The semiconductor wafer 11 may be etched until the trenches 20 may have a height h smaller than about 260 µm (micrometer) or smaller than about 250 µm (micrometer) or smaller than about 240 µm (micrometer) or smaller than about 230 µm (micrometer) or smaller than about 220 µm (micrometer) or smaller than about 210 µm (micrometer) or smaller than about 200 µm (micrometer).

The cross section of a trench 20 as shown in FIG. 4C is not necessarily of rectangular shape. Instead, the (horizontal) width of the trench 20 may increase in a direction from the frontside 13 of the semiconductor wafer 11 to the backside 17 of the semiconductor wafer 11. Hence, an angle α between a side wall of the trench 20 and a bottom of the trench 20 may be acute. For example, the angle α may be smaller than about 75° or smaller than about 70° or smaller than about 65° or smaller than about 60° or smaller than about 55° or smaller than about 50° or smaller than about 45° or smaller than about 40° or smaller than about 35° or smaller than about 30° or smaller than about 25°.

Referring back to FIG. 4B, an alternative semiconductor wafer (not illustrated) has been described in which the crossings of the scribe lines 14 may correspond to a rectangle having a smaller surface area than a crossing area formed by the scribe lines 14 limited by the rounded corners of the semiconductor chips 12. Such alternative semiconductor wafer may also be plasma etched as shown in FIG. 4C. However, alternative trenches 20' that may be obtained in this case may differ from the trenches 20 described above. In FIG. 4C, the alternative trenches 20' of the alternative case are illustrated by dashed lines, wherein an angle α' between a side wall of an alternative trench 20' and a bottom of the alternative trench 20' may particularly be greater than the angle α previously described.

The reduced surface of the rectangular crossings (see FIG. 4B) may result in smaller openings of the alternative trenches 20' on the frontside 13 of the semiconductor wafer 11. Due to the reduced size of the openings, the number of particles attacking the semiconductor material on the bottom and the side walls of the trenches 20' may be reduced. Consequently, less semiconductor material is removed from the bottom and the side walls of the trenches 20' such that the resulting angle α' may become greater than the angle α which may be based on an increased surface area due to the rounded corners of the semiconductor chips 12.

In FIG. 4D, semiconductor material may be removed from the backside 17 of the semiconductor wafer 11. For example, removing the semiconductor material may include at least one of grinding, polishing, etc. To properly perform such removal, the semiconductor wafer 11 may be mounted with its frontside 13 to a carrier (not illustrated) to stabilize the semiconductor wafer 11 during the removal. For example, semiconductor material may be removed using a first grinding wheel 21 that may perform a first grinding (or pre-grinding) of the backside 17 of the semiconductor wafer 11. A grinding surface 22 of the first grinding wheel 21 may face the backside 17 of the semiconductor wafer 11. By performing a lateral movement, e.g. by rotating the first grinding wheel 21, the moving grinding surface 22 may remove material from the backside 17 of the semiconductor wafer 11.

By applying the pre-grinding process, the thickness of the semiconductor wafer 11 may be reduced with a first grinding velocity $v_1$. For example, the first grinding velocity $v_1$ may lie in a range from e.g. about 1 μm (micrometer)/s to e.g. about 5 μm (micrometer)/s or from e.g. about 2 μm (micrometer)/s to e.g. about 4 μm (micrometer)/s. In one example, the first grinding velocity $v_1$ may have a value of e.g. about 3 μm (micrometer)/s. The thickness of the semiconductor wafer 11 may be reduced such that a distance d from the backside 17 of the semiconductor wafer 11 to the bottom of the trench 20 may lie in a range from e.g. about 10 μm (micrometer) to e.g. about 40 μm (micrometer) or from e.g. about 20 μm (micrometer) to e.g. about 30 μm (micrometer).

In FIG. 4E, the first grinding wheel 21 may be replaced by a second grinding wheel 23. The grinding surface 22 of the second grinding wheel 23 may have a finer structure than the grinding surface 22 of the first grinding wheel 21. For example, the grinding surface 22 may include a fine diamond grit (or fine diamond grains). Using the second grinding wheel 23, material may be removed from the backside 17 of the semiconductor wafer 11 similar to FIG. 4D. During this second grinding process, the semiconductor wafer 11 may remain mounted to the carrier (not illustrated) which may have already been used in the act of FIG. 4D.

By applying the second grinding process, the thickness of the semiconductor wafer 11 may be reduced with a second grinding velocity $v_2$. For example, the second grinding velocity $v_2$ may lie in a range from about 0.1 μm (micrometer)/s to about 0.5 μm (micrometer)/s or from about 0.2 μm (micrometer)/s to about 0.4 μm (micrometer)/s. In one example, the second grinding velocity $v_2$ may have a value of about 0.3 μm (micrometer)/s.

In one example, the thickness of the semiconductor wafer 11 may be reduced by using the second grinding wheel 23 such that the bottom of the trenches 20 may be removed and the semiconductor wafer 11 may be separated into the individual semiconductor chips 12. In a further example, after removing the bottom of the trenches 20, further semiconductor material may be removed from the backsides of the already separated semiconductor chips 12. For example, the thickness of the additionally removed semiconductor material may lie in a range from about 10 μm (micrometer) to about 40 μm (micrometer) or from about 20 μm (micrometer) to about 30 μm (micrometer).

The thickness $t_2$ of a separated semiconductor chip 12 after the second grinding process may be smaller than about 300 μm (micrometer) or smaller than about 250 μm (micrometer) or smaller than about 200 μm (micrometer) or smaller than about 175 μm (micrometer) or smaller than about 150 μm (micrometer) or smaller than about 125 μm (micrometer). An inner angle β between the backside 17 of the semiconductor chip 12 and the side surface of the semiconductor chip 12 may be obtuse. The inner angle β may have a value of about (180°-α). Possible values for the inner angle β may become apparent from previous comments. For example, the inner angle may be greater than e.g. about 110°.

When removing the bottom of the trenches 20 and thereby separating the semiconductor chips 12 from each other, an edge or a corner, e.g. at the position of the angles α and α' (see FIG. 4C), on the backside 17 of a semiconductor chip 12 may break due to the described grinding processes. The probability of an edge or a corner to break during the grinding processes may be reduced for the geometry based on the angle α compared to the geometry based on the angle α'. For the case of the angle α, the edges or corners on the backside 17 of the semiconductor chip 12 may have been at least partly removed and thus may be flatter and thus less prone to breaking. That is, choosing an increased surface area between the semiconductor chips 12 (see FIG. 4B) may result in an increased angle α between the side wall of the trench 20 and the bottom of the trench 20 which may in turn result in a reduced break-off and reduced damage of the semiconductor chips 12 on the edges or corners of their backside 17.

FIG. 4F illustrates a top view of an exemplary separated semiconductor chip 12. The semiconductor chip 12 may include rounded corners 16. That is, an outline of the frontside 13 of the semiconductor chip 12 may include a corresponding number of arc-shaped line segments. In the example of FIG. 4F, the semiconductor chip 12 may include four rounded corners due to its substantially rectangular shape. In further examples, the semiconductor chip 12 may include a varying number of rounded corners. In other examples, one or more of the rounded corners may be replaced by beveled corners such that the outline of the frontside 13 of the semiconductor chip 12 may include a corresponding number of polygonal lines including two line segments joined together at an inner angle a of greater than 90°. In general, the semiconductor chip 12 may include a varying number of rounded corners and/or a varying number of beveled corners.

One or more side surfaces of the semiconductor chip 12 extending from the backside 17 to the frontside 13 may be plasma etched and thus may include an undulation. For example, the undulation may have an amplitude from about 100 nm to about 5 μm (micrometer). In addition, due to an employed plasma etching technique, defects extending from the side surface of the semiconductor chip 12 into the material of the semiconductor chip 12 may have a reduced dimension, for example a dimension of smaller than about 20 μm (micrometer).

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise". Also, the term "exemplary" is merely meant as an example, rather than the best or optimal. Features and/or elements depicted herein are illustrated with particular dimensions relative to each other for purposes of simplicity and ease of understanding, and that actual dimensions may differ substantially from that illustrated herein.

Although specific examples have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A method of separating semiconductor chips, comprising:
   providing a semiconductor wafer comprising multiple semiconductor chips;
   forming a first scribe line on a frontside of the semiconductor wafer, wherein the first scribe line has a first width and separates semiconductor chips of the semiconductor wafer;
   forming a second scribe line on the frontside of the semiconductor wafer, wherein the second scribe line has a second width and separates semiconductor chips of the semiconductor wafer, wherein the first scribe line and the second scribe line intersect in a crossing area which is greater than a product of the first width and the second width;
   plasma etching the semiconductor wafer in the crossing area and in the first scribe line and the second scribe line outside of the crossing area, wherein plasma etching the semiconductor wafer comprises forming a trench in the semiconductor wafer, wherein a bottom of the trench and a side wall of the trench form an angle of smaller than 70°, and
   separating a semiconductor chip from the semiconductor wafer, wherein an outline of a frontside of the semiconductor chip comprises a beveled corner and/or a rounded corner, wherein the semiconductor chip comprises a backside and a side surface, the side surface extending along the entire outline of the frontside from the frontside to the backside, wherein the sidewall of the trench in the semiconductor wafer becomes the side surface of the semiconductor chip, wherein the entire side surface is plasma etched, and wherein the backside of the semiconductor chip is exposed.

2. The method of claim 1, further comprising:
   forming a first semiconductor chip of the multiple semiconductor chips, wherein an outline of the first semiconductor chip on the frontside of the semiconductor wafer comprises a first beveled corner and/or a first rounded corner, and wherein a part of the crossing area is defined by the first beveled corner and/or the first rounded corner.

3. The method of claim 2, further comprising:
   forming a second semiconductor chip of the multiple semiconductor chips, wherein an outline of the second semiconductor chip on the frontside of the semiconductor wafer comprises a second beveled corner and/or a second rounded corner, wherein a part of the crossing area is defined by the second beveled corner and/or the second rounded corner.

4. The method of claim 1, further comprising:
   forming at least one semiconductor chip of the multiple semiconductor chips, wherein an outline of the at least one semiconductor chip on the frontside of the semiconductor wafer comprises a polygonal line comprising two line segments joined together at an inner angle of greater than 90° and/or an arc-shaped line, wherein a part of the crossing area is defined by the polygonal line and/or the arc-shaped line.

5. The method of claim 1, and wherein a height of the trench is smaller than 230 micrometers.

6. The method of claim 1, further comprising:
   after plasma etching, removing semiconductor material from the backside of the semiconductor wafer until at least one of the multiple semiconductor chips is separated from the semiconductor wafer.

7. The method of claim 6, wherein removing the semiconductor material comprises at least one of grinding and polishing.

8. The method of claim 6, wherein the separated semiconductor chip has a thickness of smaller than 200 micrometers.

9. A method of separating semiconductor chips, comprising:
   providing a semiconductor wafer;
   forming at least one semiconductor chip from the semiconductor wafer, wherein an outline of the at least one semiconductor chip on a frontside of the semiconductor wafer comprises a beveled corner and/or a rounded corner;
   plasma etching the semiconductor wafer along the entire outline of the at least one semiconductor chip including an area that is at least partly limited by the beveled corner and/or the rounded corner, wherein plasma etching the semiconductor wafer comprises forming a trench in the semiconductor wafer, wherein a bottom of the trench and a side wall of the trench form an angle of smaller than 70°; and
   separating the at least one semiconductor chip from the semiconductor wafer, wherein an outline of a frontside of the semiconductor chip comprises the beveled corner and/or the rounded corner, wherein the semiconductor chip comprises a backside and a side surface, the side surface extending along the entire outline of the frontside from the frontside to the backside, wherein the side wall of the trench in the semiconductor wafer becomes the side surface of the semiconductor chip, wherein the entire side surface is plasma etched, and wherein the backside of the semiconductor chip is exposed.

10. The method of claim 9, further comprising:
    after plasma etching, removing semiconductor material from the backside of the semiconductor wafer until the at least one semiconductor chip is separated from the semiconductor wafer.

11. The method of claim 10, wherein removing the semiconductor material comprises at least one of grinding and polishing.

12. A semiconductor device, comprising:
    a semiconductor chip, wherein an outline of a frontside of the semiconductor chip comprises a beveled corner and/ or a rounded corner, wherein the semiconductor chip comprises a backside and a side surface, the side surface extending along the entire outline of the frontside from the frontside to the backside, wherein the entire side surface is plasma etched, wherein the backside is exposed and an inner angle between the backside and the side surface is greater than 110°.

13. The device of claim 12, wherein the frontside of the semiconductor chip comprises at least one of a doped region, an electrical component, and an integrated circuit.

14. The device of claim 12, wherein the semiconductor chip comprises a backside and a side surface extending from the backside to the frontside, wherein at least a part of the side surface is plasma etched.

15. The device of claim 12, wherein the semiconductor chip comprises a backside and a side surface extending from the backside to the frontside, wherein defects extending from the side surface into the semiconductor chip have a dimension of smaller than 20 micrometers.

16. The device of claim 12, wherein the semiconductor chip comprises a backside and a side surface extending from the backside to the frontside, wherein the side surface comprises an undulation, wherein the undulation has an amplitude from 100 nanometers to 5 micrometers.

17. The device of claim 12, wherein a thickness of the semiconductor chip is smaller than 200 micrometers.

* * * * *